United States Patent
Miyata

(10) Patent No.: US 7,659,128 B2
(45) Date of Patent: Feb. 9, 2010

(54) METHOD OF PROCESSING SILICON WAFER AND METHOD OF MANUFACTURING LIQUID EJECTING HEAD

(75) Inventor: Yoshinao Miyata, Matsukawa-mura (JP)

(73) Assignee: Seiko Epson Corporation, Tokyo (JP)

( * ) Notice: Subject to any disclaimer, the term of this patent is extended or adjusted under 35 U.S.C. 154(b) by 138 days.

(21) Appl. No.: 12/053,188

(22) Filed: Mar. 21, 2008

(65) Prior Publication Data

US 2008/0233713 A1    Sep. 25, 2008

(30) Foreign Application Priority Data

Mar. 22, 2007    (JP)    ............... 2007-075642

(51) Int. Cl.
 *H01L 21/00*    (2006.01)
(52) U.S. Cl. .................. 438/21; 438/460; 438/462; 257/E21.599
(58) Field of Classification Search ............... 438/21, 438/113, 460, 462; 257/E21.599; 347/68
See application file for complete search history.

(56) References Cited

U.S. PATENT DOCUMENTS 6,878,609 B2* 4/2005 Wanibe et al. ............. 438/460
7,210,769 B2* 5/2007 Yasoshima ................... 347/70
7,381,341 B2* 6/2008 Shimada et al. ............. 216/27
2008/0113459 A1* 5/2008 Takahashi et al. ........... 438/21

FOREIGN PATENT DOCUMENTS

| JP | 05-155030 | 6/1993 |
|---|---|---|
| JP | 06-275850 | 9/1994 |
| JP | 07-058345 | 3/1995 |
| JP | 11-285275 | 10/1999 |
| JP | 2002-313754 | 10/2002 |
| JP | 2006-175668 | 7/2006 |
| JP | 2006-187973 | 7/2006 |

* cited by examiner

*Primary Examiner*—Tuan N. Quach
(74) *Attorney, Agent, or Firm*—Workman Nydegger

(57) ABSTRACT

A break pattern is formed on a silicon wafer using an anisotropic etching process. The break pattern includes a plurality of through holes, each of having a first plane perpendicular to a plane defined by the silicon wafer, a second plane opposite to the first plane, a third plane that is perpendicular to the plane of the silicon wafer and intersects the first plane at an acute angle, and a fourth plane that is opposite to the third plane, is perpendicular to the plane of the silicon wafer, and intersects the second plane at an acute angle. The anisotropic etching is performed using a mask pattern having a predetermined shape to form, around the break pattern, a thin portion that has a smaller thickness than other portions of the silicon wafer. The silicon wafer is then divided into a plurality of silicon substrates along the break pattern.

3 Claims, 12 Drawing Sheets

METHOD OF PROCESSING SILICON WAFER AND METHOD OF MANUFACTURING LIQUID EJECTING HEAD

The entire disclosure of Japanese Patent Application No. 2007-75642, filed Mar. 22, 2007 is expressly incorporated by reference herein.

BACKGROUND

1. Technical Field

The present invention relates to a method of processing a silicon wafer including a plurality of silicon substrates and a method of manufacturing a liquid ejecting head that ejects liquid droplets, and more particularly, to a method of manufacturing an ink jet recording head that discharges ink droplets as liquid droplets, using a silicon wafer.

2. Related Art

For example, liquid ejecting heads have been proposed which apply pressure to liquid contained in pressure generating chambers using pressure generating units, such as piezo-electric elements, to discharge liquid droplets from nozzles. A representative example of the liquid ejecting heads is an ink jet recording head that discharges ink droplets as the liquid droplets. As the ink jet recording head, the following one has been proposed: pressure generating units, such as piezo-electric elements, are formed on one surface of a passage forming substrate having pressure generating chambers formed therein; and a nozzle plate having nozzles provided therein is bonded to the other surface of the passage forming substrate.

The passage forming substrate forming the ink jet recording head is composed of, for example, a silicon monocrystal substrate having a (110) plane as its one surface. The passage forming substrate is manufactured as follows: a plurality of passage forming substrates are integrally formed on the silicon wafer; and the silicon wafer is divided into individual passage forming substrates.

For example, as a method of dividing the silicon wafer, the following has been proposed: a break pattern having a plurality of through holes arranged at predetermined intervals is formed on cut lines between a plurality of passage forming substrates (silicon substrates) that are formed on a silicon wafer; and the silicon wafer is divided along the break pattern (for example, see Japanese Unexamined Patent Application Publication No. 2006-175668). As described in Japanese Unexamined Patent Application Publication No. 2006-175668, regions in the vicinity of the break pattern in the silicon wafer are partially etched in the thickness direction of the silicon wafer, thereby forming thin portions that have a smaller thickness than other portions.

When the silicon wafer is etched to form the thin portions, a residual portion including a (111) plane that is inclined with respect to the surface of the silicon wafer is formed in each of the through holes forming the break pattern. Specifically, each of the through holes includes a first (111) plane that is perpendicular to the (110) plane of the silicon wafer, a second (111) plane that is opposite to the first (111) plane, a third (111) plane that is perpendicular to the (110) plane and intersects the first (111) plane at an acute angle, and a fourth (111) plane that is opposite to the third (111) plane, is perpendicular to the (110) plane, and intersects the second (111) plane at an acute angle. The residual portions are formed on acute portions of each of the through holes, that is, an angular portion where the first (111) plane and the third (111) plane intersect with each other and an angular portion where the second (111) plane and the fourth (111) plane intersect with each other.

Japanese Unexamined Patent Application Publication No. 2006-175668 discloses a technique for intentionally leaving the residual portions on the acute portions when the through holes are formed in the silicon wafer, thereby reinforcing the break pattern.

Such residual portions are formed when thin portions are formed as well as when the through holes are formed. For example, even when the residual portions are not formed during a process of forming the through holes, the formation of the thin portions causes the residual portions to be formed in the acute portions.

The residual portions lower the breakability of the silicon wafer, and the presence of the residual portions causes unstable cut lines. For this reason, it is not always advantageous to remain the residual portions, but it is necessary to form the through holes without the residual portions according to various conditions, such as the thickness of the silicon wafer.

These problems occur when a silicon wafer is divided into a plurality of silicon substrates as well as in a method of manufacturing liquid ejecting heads, such as ink jet recording heads.

SUMMARY

An advantage of some aspects of the invention is to provide a method of processing a silicon wafer and a method of manufacturing a liquid ejecting head capable of accurately dividing a silicon wafer into silicon substrates along a break pattern.

According to an aspect of the invention, there is provided a method of processing a silicon wafer. The method includes: forming, on a silicon wafer having a (110) plane as its one surface, a break pattern including a plurality of through holes, each of which has a first (111) plane that is perpendicular to the (110) plane of the silicon wafer, a second (111) plane that is opposite to the first (111) plane, a third (111) plane that is perpendicular to the (110) plane and intersects the first (111) plane at an acute angle, and a fourth (111) plane that is opposite to the third (111) plane, is perpendicular to the (110) plane, and intersects the second (111) plane at an acute angle, using anisotropic etching; performing the anisotropic etching on the silicon wafer using a mask pattern having a predetermined shape to form, around the break pattern, a thin portion that has a smaller thickness than other portions of the silicon wafer; and dividing the silicon wafer into a plurality of silicon substrates along the break pattern. The forming of the thin portion includes: forming a correction pattern that covers the edges of acute portions of each of the through holes in the silicon wafer so as to protrude from the edges by a predetermined width; and performing the anisotropic etching on the silicon wafer using the mask pattern including the correction pattern, thereby delaying the start of the etching of the edges of the acute portions in the silicon wafer.

According to the above-mentioned aspect, when the thin portions are formed, the residual portion remaining in each of the acute portions includes an end surface that is perpendicular to the (110) plane. Therefore, it is possible to prevent the breakability of a silicon wafer from being lowered. As a result, it is possible to accurately divide a silicon wafer into silicon substrates along the break pattern.

In the method according to the above-mentioned aspect, preferably, the break pattern is formed along the first (111) plane such that the first (111) plane and the second (111)

plane of the through holes are alternately arranged on a straight line. According to the above-mentioned structure, it is possible to further improve the breakability of a silicon wafer and accurately break the silicon wafer. That is, it is possible to accurately divide the silicon wafer along cut lines easily.

According to another aspect of the invention, there is provided a method of manufacturing a liquid ejecting head including a passage forming substrate in which pressure generating chambers which communicate with nozzles and to which pressure for ejecting liquid droplets from the nozzles is applied are formed. The method includes: integrally forming a plurality of passage forming substrates on a wafer for a passage forming substrate, which is a silicon wafer having a (110) plane as its one surface; and dividing the wafer for a passage forming substrate into the plurality of the passage forming substrates using the method of processing a silicon substrate according to the above-mentioned aspect. According to the above-mentioned structure, it is possible to easily form a liquid ejecting head with high accuracy and considerably reduce manufacturing costs.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, exemplary embodiments of the invention will be described in detail with reference to the accompanying drawings.

First Embodiment

Figure 1:
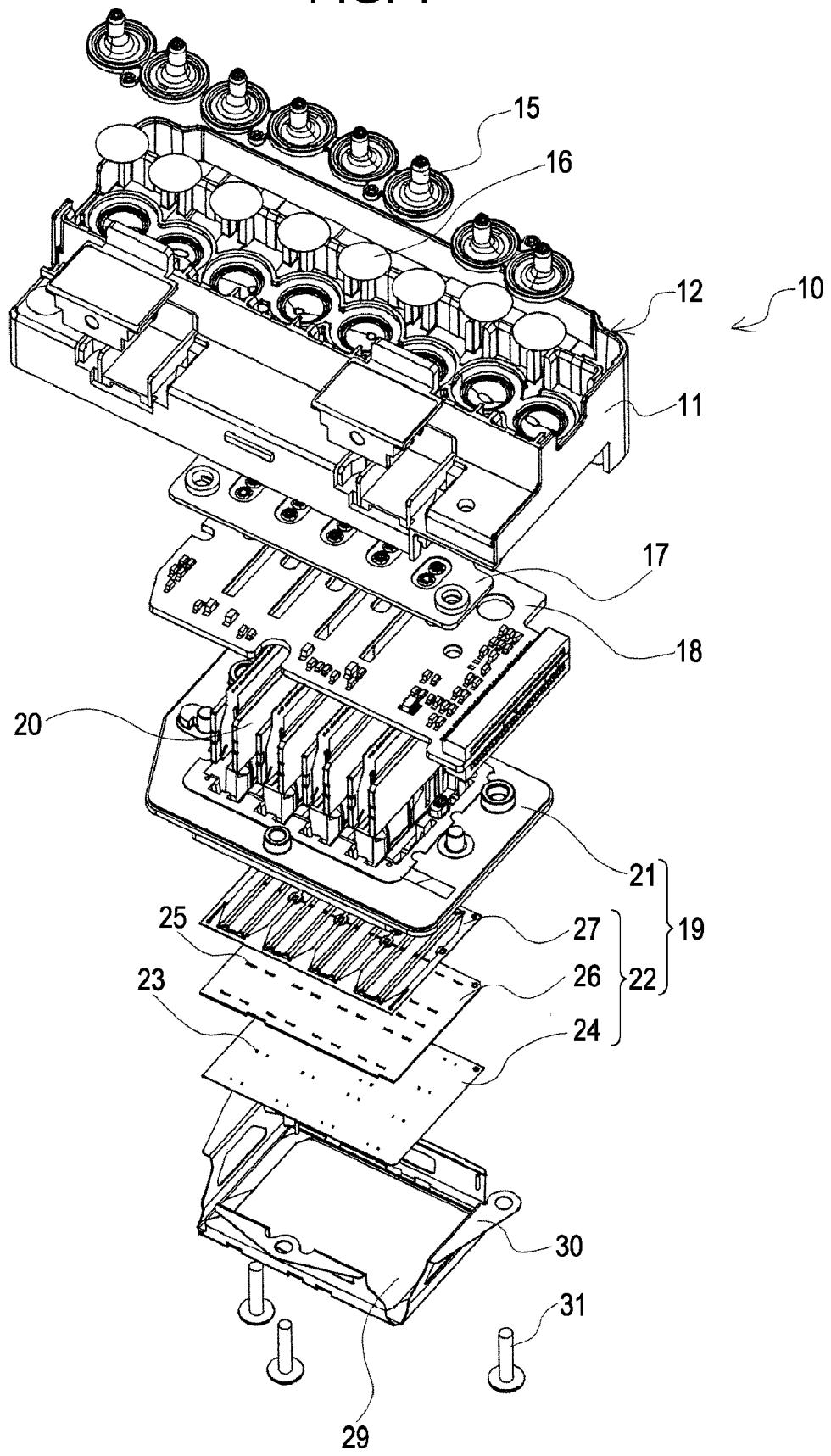
FIG. 1 is an exploded perspective view illustrating an example of a recording head.
Figure 2:
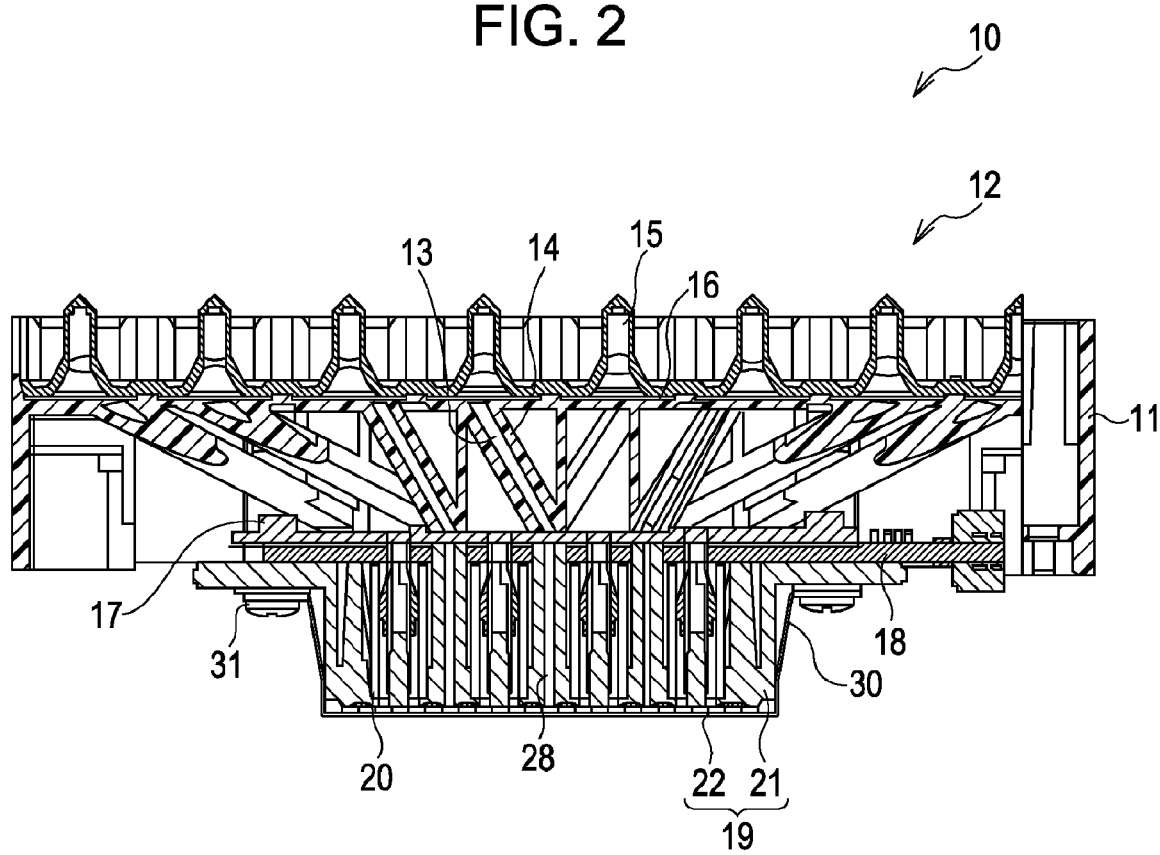
FIG. 2 is a cross-sectional view illustrating the recording head.

FIG. 1 is an exploded perspective view illustrating an ink jet recording head, which is an example of a liquid ejecting head, and FIG. 2 is a cross-sectional view illustrating the ink jet recording head.

As shown in FIGS. 1 and 2, a cartridge case 11, which is an example of a head holder forming an ink jet recording head 10, includes cartridge mounting units 12 to which ink cartridges (not shown) are mounted. For example, an ink cartridge filled with black ink and ink cartridges filled with a plurality of different color inks are mounted to the cartridge mounting units 12. Tubal passage forming portions 14, each having an ink passage 13 formed therein, protrude from a lower surface of the cartridge case 11. One end of each of the ink passages 13 is opened toward the corresponding cartridge mounting unit 12, and the other end thereof is opened toward a head case, which will be described below.

A plurality of ink supply needles 15 that are inserted into the ink cartridges are fixed to an upper surface of the cartridge case 11, that is, the openings of the ink passages 13 of the cartridge mounting units 12, with a filter 16 that removes bubbles or foreign materials from ink interposed therebetween.

A head member 19 is fixed to the lower surface of the cartridge case 11 with a sealing member 17 and a circuit board 18 interposed therebetween. The head member 19 includes a piezo-electric element unit 20 having a plurality of piezo-electric elements, a head case 21, which is a hollow box-shaped member that accommodates the piezo-electric element unit 20, and a head body 22 that is fixed to a surface of the head case 21 opposite to the cartridge case 11. The head body 22, which will be described in detail below, includes a nozzle plate 24 having a plurality of nozzle 23 formed therein, a passage forming substrate 26 having passages including pressure generating chambers 25 that communicate with the nozzles 23 formed therein, and a diaphragm 27 that is provided on a surface of the passage forming substrate 26 opposite to the nozzle plate 24. In addition, the head case 21 is provided with ink supply passages 28 each of which has one end communicating with the pressure generating chamber 25 and the other end communicating with the ink passage 13 of the cartridge case 11.

The sealing member 17, the circuit board 18, and the head case 21 and the head body 22 of the head member 19 are sequentially provided in this order on the lower surface of the cartridge case 11, and a frame 30 having a window member 29 that allows the nozzles 23 of the head body 22 to be exposed is fitted outside the edges of these members. Then, the laminate is fixed to the cartridge case 11 by screws 31 to form the ink jet recording head 10.

Figure 3A:
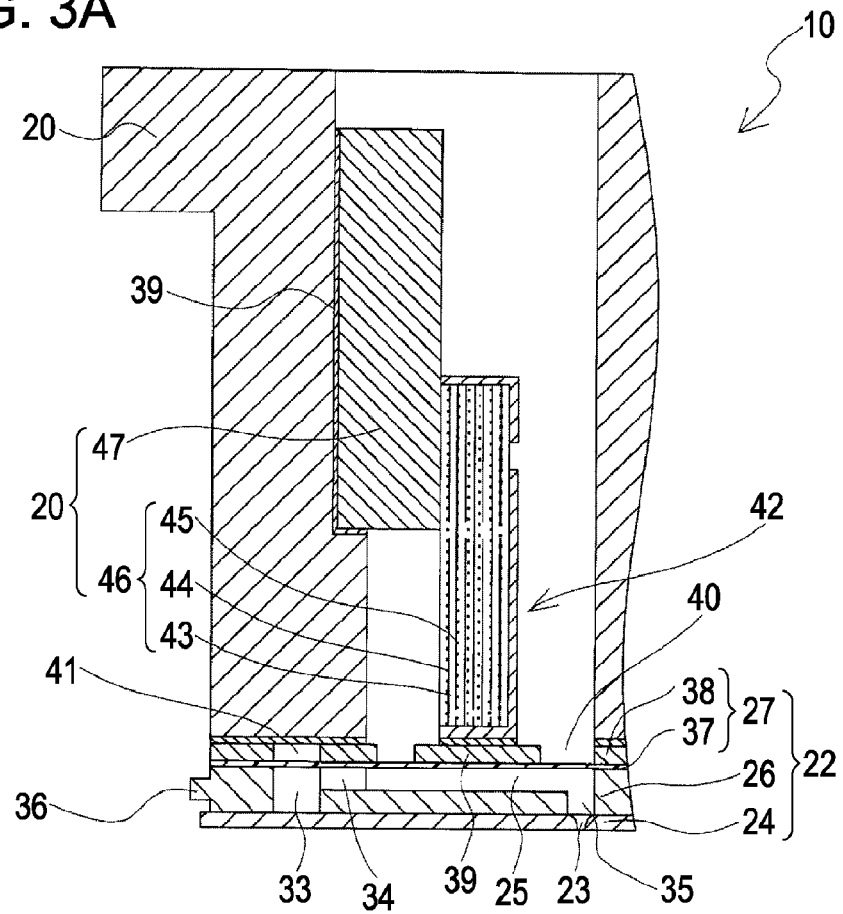
FIGS. 3A and 3B are partial cross-sectional views illustrating the recording head.
Figure 3B:
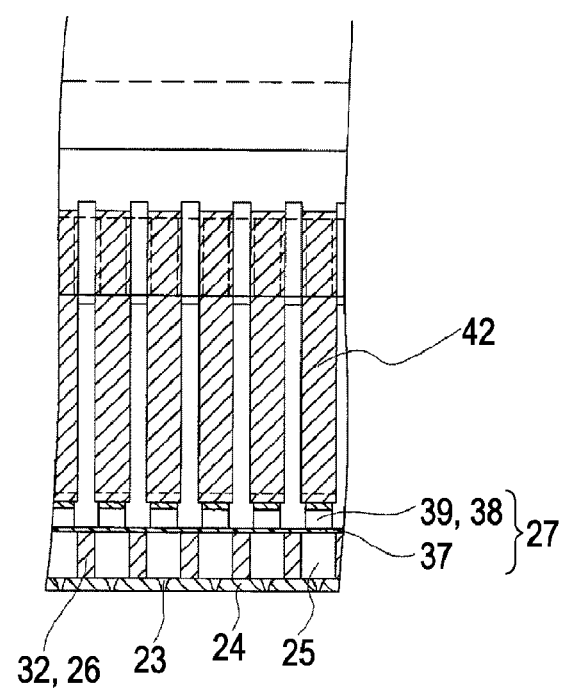

As described above, the head body 22 includes the nozzle plate 24, the passage forming substrate 26, and the diaphragm 27. Specifically, as shown in FIGS. 3A and 3B, in the vicinity of one surface of the passage forming substrate 26 of the head body 22, a plurality of pressure generating chambers 25 are partitioned by partition walls 32 and arranged in parallel to each other in the width direction thereof. A reservoir 33 that supplies ink to the pressure generating chambers 25 is provided outside a row of pressure generating chambers 25 so as to pass through the passage forming substrate 26 in the thickness direction thereof. The pressure generating chambers 25 and the reservoir 33 communicate with each other through the ink supply passages 34. The ink supply passage 34 has a smaller width than the pressure generating chamber 25, and maintains the passage resistance of ink flowing from the reservoir 33 to the pressure generating chamber 25 to be constant. A nozzle communication hole 35 is formed on one side of the pressure generating chamber 25 opposite to the reservoir 33 so as to pass through the passage forming substrate 26. The passage forming substrate 26 is composed of a silicon monocrystal substrate having a (110) plane as its one surface, and passages formed in the passage forming substrate 26, such as the pressure generating chambers 25, are formed by performing anisotropic etching on the passage forming substrate 26.

Figure 4:
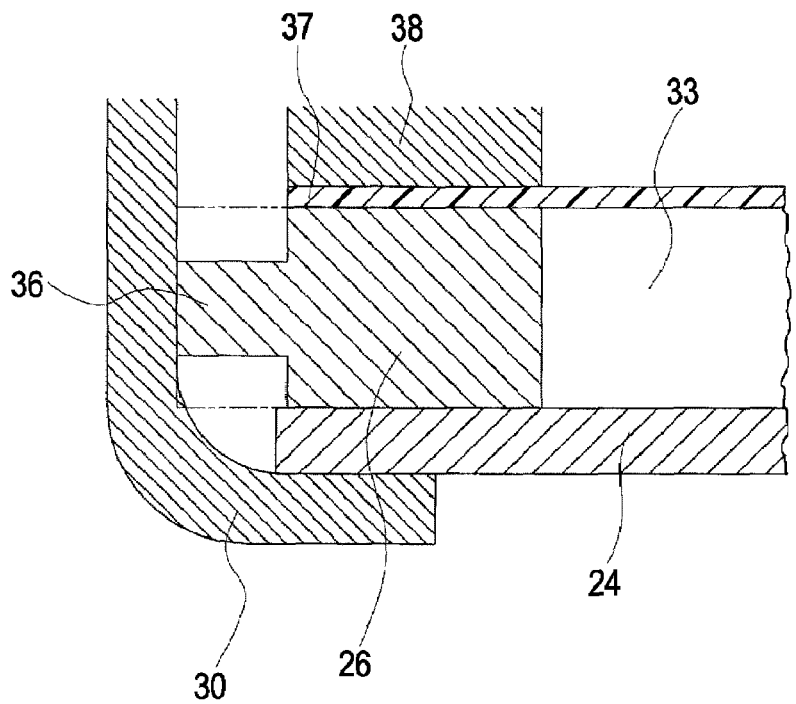
FIG. 4 is a partial enlarged cross-sectional view illustrating the recording head.

A thin portion 36 having a smaller thickness than the other components of the passage forming substrate 26 is formed at the edge of the passage forming substrate 26. In this way, when the ink jet recording head 10 is assembled, it is possible to prevent the passage forming substrate 26 from being broken. Specifically, as shown in FIG. 4, when the head body 22 is fixed to the lower surface of the cartridge case 11 by the frame 30, the thin portion 36 formed in the passage forming substrate 26 prevents interference between the head body 22 and the frame 30, that is, contact therebetween. That is, it is possible to prevent the passage forming substrate 26 from being broken or cracked.

The nozzle plate 24 is bonded to the passage forming substrate 26 by an adhesive or a hot melt film, and each of the nozzles 23 communicates with the pressure generating chamber 25 through the nozzle communication hole 35 provided in the passage forming substrate 26.

The diaphragm 27 is a composite plate of an elastic film 37 that is formed of, for example, an elastic film, such as a resin film, and a support plate 38 that supports the elastic film 37 and is formed of, for example, a metallic material, and the elastic film 37 is bonded to the passage forming substrate 26. In addition, island portions 39 are provided in portions of the diaphragm 27 facing the pressure generating chambers 25. That is, thin firm portions 40 are formed in regions of the diaphragm 27 facing the circumferential portions of the pressure generating chambers 25. In this case, the thicknesses of the thin firm portions 40 are smaller than other regions of the diaphragm 27. The island portions 39 are provided inside the thin film portions 40. In addition, similar to the thin film portions 40, a compliance portion 41 is provided in a region of the diaphragm 27 facing the reservoir 33. The compliance portion 41 is formed by etching the support plate 38 and is composed of only the elastic film.

Each of the piezo-electric elements 42 forming the piezo-electric element unit 20 is provided such that the leading end of an active region thereof comes into contact with the corresponding island portion 39 of the diaphragm 27.

The piezo-electric elements 42 are integrally formed in one piezo-electric element unit 20. That is, a piezo-electric material 43 is interposed between electrode forming materials 44 and 45 in the vertical direction to form a piezo-electric element forming member 46, and the piezo-electric element forming member 46 is cut in a comb teeth shape to correspond each of the pressure generating chambers 25, thereby forming each piezo-electric element 42. That is, in this embodiment, a plurality of piezo-electric elements 42 are integrally formed. An inactive region that does not contribute to the vibration of the piezo-electric element 42 (piezo-electric element forming member 46), that is, a base of the piezo-electric element 42 is fixed to a fixed substrate 47.

Figure 5:
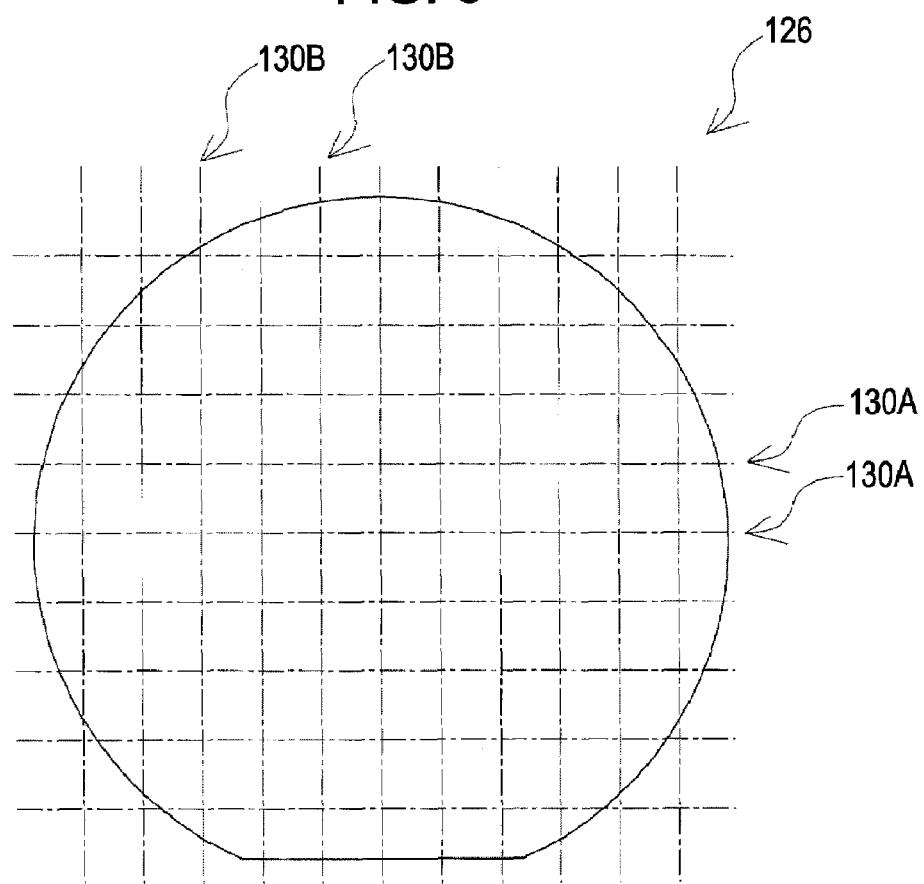
FIG. 5 is a plan view illustrating a wafer for a passage forming substrate.

As described above, the passage forming substrate 26 forming the head body 22 is formed of a silicon monocrystal substrate that has a (110) plane as its one surface. For example, as shown in FIG. 5, a plurality of passage forming substrates 26 are integrally formed in a wafer 126 for a passage forming substrate, which is a silicon wafer having a diameter of about 6 inches, and the wafer 126 for a passage forming substrate is cut along first and second cut lines 130A and 130B that are represented by one-dot chain lines in FIG. 5, thereby forming the passage forming substrates 26.

The first cut lines 130A are drawn along a first (111) plane that is perpendicular to the (110) plane, and the second cut lines 130B are drawn in an axial direction of the first (111) plane of the wafer 126 for a passage forming substrate. In this embodiment, since an orientation flat of the wafer 126 for a passage forming substrate is formed along the first (111) plane, the first cut lines 130A are drawn in the direction that is aligned with the orientation flat, and the second cut lines 130B are drawn in the direction that is orthogonal to the orientation flat.

Figure 6A:
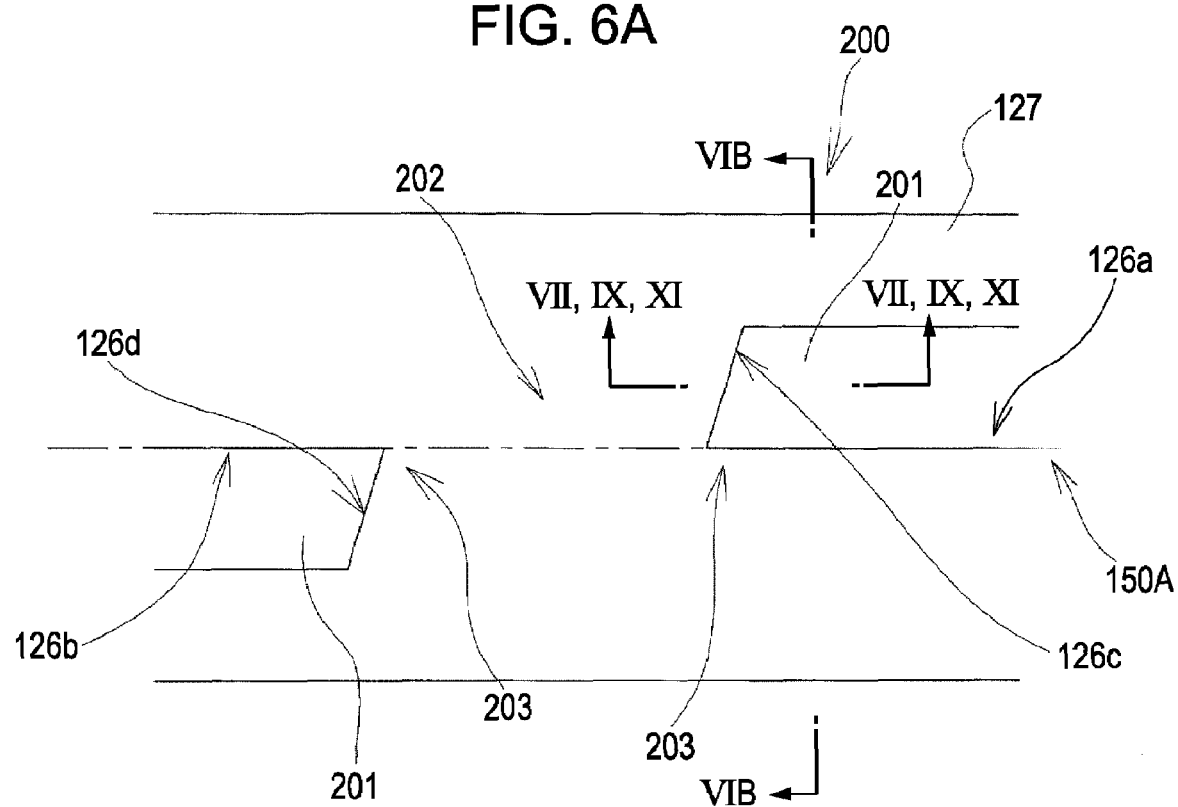
FIGS. 6A and 6B are a plan view illustrating an example of a break pattern and a cross-sectional view taken along the line VIB-VIB of FIG. 6A, respectively.
Figure 6B:
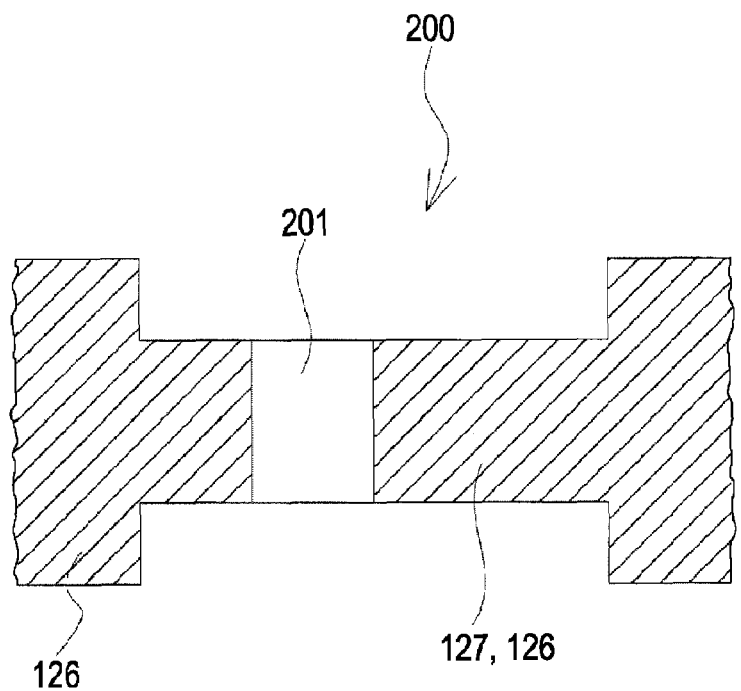

A break pattern in which a plurality of through holes are arranged at predetermined intervals is formed on the first and second cut lines 130A and 130B. For example, as shown in FIG. 6A, a break pattern 200 including a plurality of through holes 201 having substantially rectangular shapes in a plan view arranged therein is formed on the first cut lines 130A. Each of the through holes 201 includes a first (111) plane 126a that is perpendicular to the surface ((110) plane) of the wafer 126 for a passage forming substrate, a second (111) plane 126b that is opposite to the first (111) plane 126a, a third (111) plane 126c that is perpendicular to the (110) plane and intersects the first (111) plane 126a at an acute angle, and a fourth (111) plane 126d that is opposite to the third (111) plane 126c, is perpendicular to the (110) plane, and intersects the second (111) plane 126b at an acute angle. In the wafer 126 for a passage forming substrate, as shown in FIG. 6B, small thickness portions 127, serving as the thin portions 36, are provided along the break pattern 200. That is, the through holes 201 forming the break pattern 200 are provided in the small thickness portions 127 of the wafer 126 for a passage forming substrate.

A portion between the through holes 201 serves as a fragile portion 202. When an external force is applied to the fragile portions of the wafer 126 for a passage forming substrate, the wafer 126 for a passage forming substrate is divided along the break pattern 200. That is, the wafer 126 for a passage forming substrate is divided into the passage forming substrates 26.

The arrangement of the through holes 201 in the break pattern 200 is appropriately determined. For example, it is preferable that the through holes 201 of the break pattern 200 provided on the first cut line 130A be formed such that the first (111) plane 126a and the second (111) plane 126b of the through holes 201 are alternately arranged on a straight line, that is, on the first cut line 130A (see FIGS. 6A and 6B). In this case, it is possible to accurately divide the wafer 126 for a passage forming substrate along the break pattern 200 (the cut lines 130).

Figure 7A:
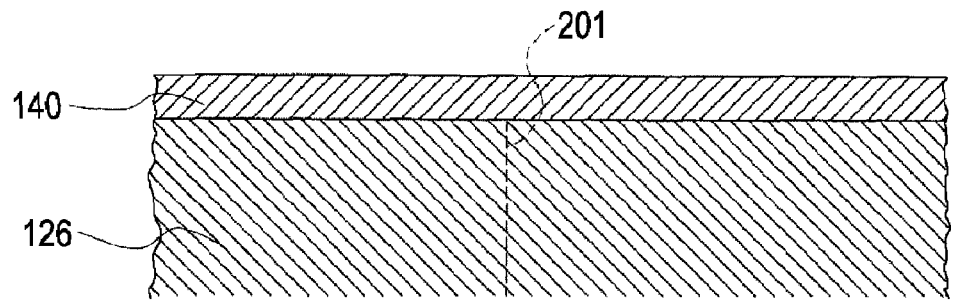
FIGS. 7A to 7C are cross-sectional views schematically illustrating a method of manufacturing a recording head according to a first embodiment of the invention.

The break pattern 200 is formed as follows, for example. FIGS. 7A to 7C, 9A to 9C, and 11A and 11B are cross-sectional views taken along the lines VII-VII, IX-IX, and XI-XI, respectively, and FIGS. 8 and 10 are plan views thereof. Specifically, first, as shown in FIG. 7A, the wafer 126 for a passage forming substrate, which is a silicon wafer having a (110) plane as its one surface, is thermally oxidized in, for example, a diffusion furnace, thereby forming a protective film 140 made of a silicon dioxide in a region in which the through holes 201 are formed. Actually, the protective film 140 is provided on the entire surface of the wafer 126 for a passage forming substrate. The protective film 140 is used as a mask pattern when the wafer 126 for a passage forming substrate is etched in a subsequent process. Therefore, the protective film 140 may be formed of materials other than the silicon dioxide as long as the materials have different etching characteristics from the wafer 126 for a passage forming substrate.

Figure 7B:
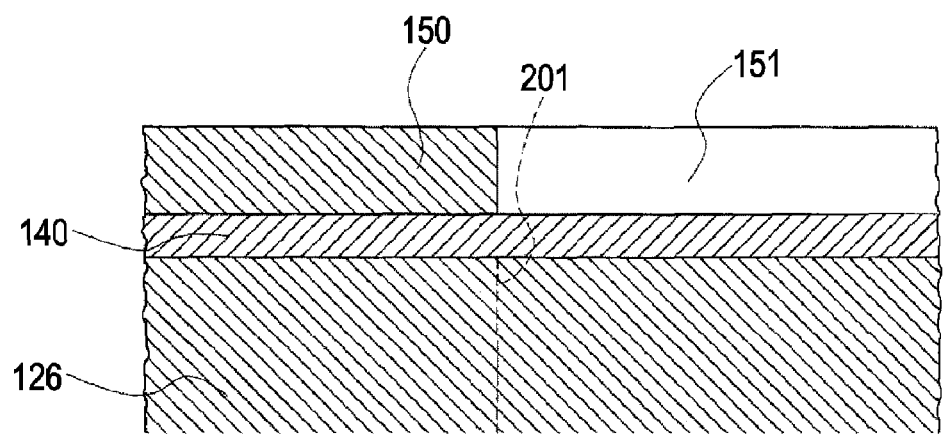
Figure 8:
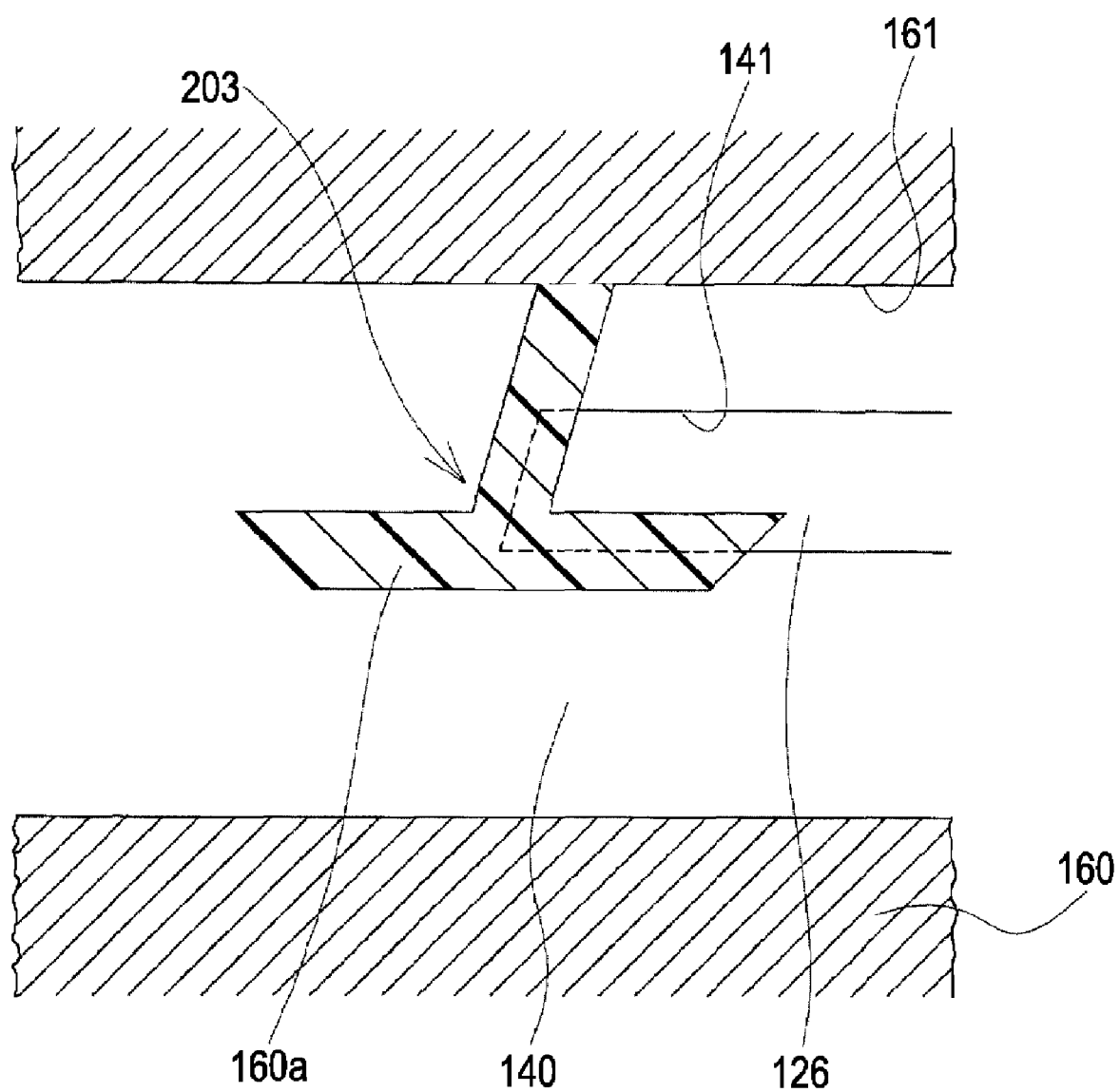
FIG. 8 is a plan view schematically illustrating the method of manufacturing the recording head according to the first embodiment of the invention.

Then, as shown in FIG. 7B, a resist film 150 having a predetermined pattern is formed on the protective film 140 that is formed on the surface of the wafer 126 for a passage forming substrate. That is, the resist film 150 having openings 151 is formed on the protective film 140 in a region in which the through holes 201 forming the break pattern are provided. The openings 151 are formed in both surfaces of the wafer 126 for a passage forming substrate. The resist is formed by applying, for example, a negative resist by a spin coating method, and then exposure, development, and baking processes are performed on the resist using a predetermined mask, thereby forming the resist film 150. Of course, a positive resist may be used instead of the negative resist.

Figure 7C:
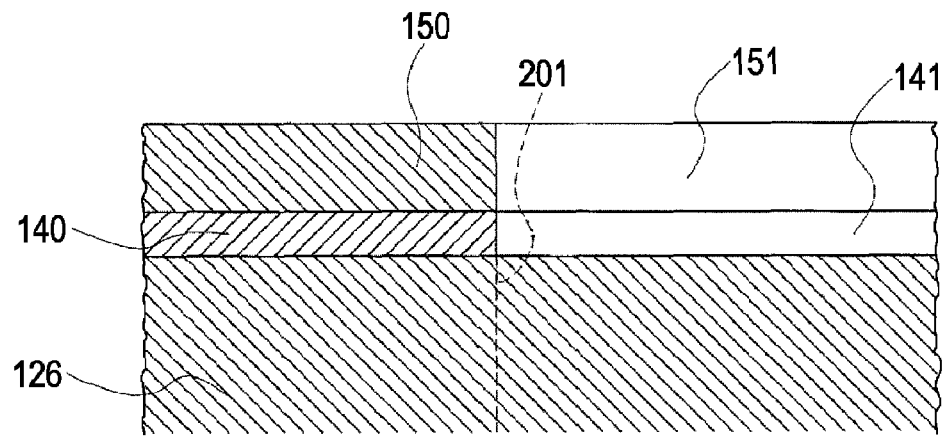

Then, as shown in FIG. 7C, the protective film 140 is etched with, for example, hydrofluoric acid using the resist film 150 as a mask, thereby forming opening portions 141 in the region of the protective film 140 in which the through holes 201 are formed. That is, the opening portions 141 are formed along the first to fourth (111) planes 126a to 126d of the wafer 126 for a passage forming substrate (see FIGS. 6A and 6B).

Figure 9A:
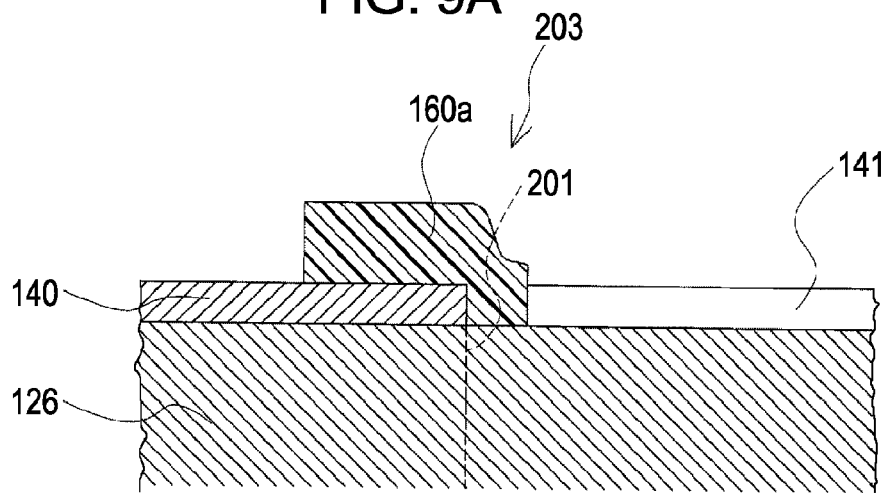
FIGS. 9A to 9C are cross-sectional views schematically illustrating the method of manufacturing the recording head according to the first embodiment of the invention.
Figure 10:
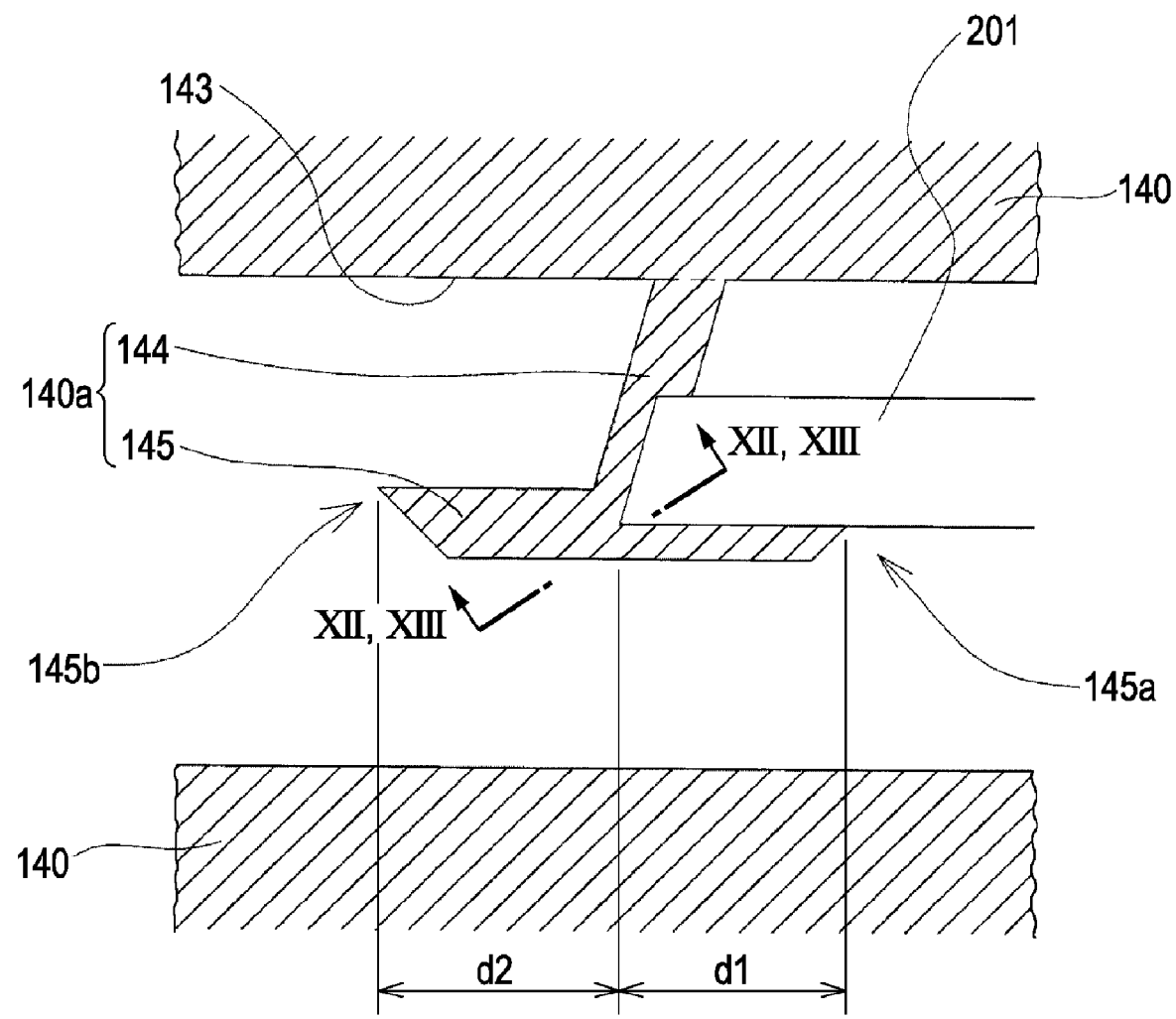
FIG. 10 is a plan view schematically illustrating the method of manufacturing the recording head according to the first embodiment of the invention.

Then, after the resist film 150 is removed, as shown in FIGS. 8 and 9A, a resist is applied again to form a resist film 160. That is, the resist film 160 having openings 161 is formed in the region in which the small thickness portion 127 is formed. At that time, a resist film 160a remains to cover a region corresponding to the edge of an acute portion 203 of each of the through holes 201 forming the break pattern so as to protrude from the edge by a predetermined width. The acute portions 203 of each of the through holes 201 include an angular portion formed between the first (111) plane 126a and the third (111) plane 126c that intersects the first (111) plane 126a at an acute angle, and an angular portion formed between the second (111) plane 126b and the fourth (111) plane 126d that intersects the second (111) plane 126b an acute angle in each of the through holes 201 (see FIGS. 6A and 6B). For example, in this embodiment, as shown in FIG. 8, the resist film 160a having a substantially T shape that covers a region opposite to the edge of the third (111) plane 126c and the edge of the first (111) plane 126a remains. As shown in FIG. 9A, it is preferable that a portion of the resist film 160a corresponding to the acute portion 203 protrude toward the opening portion 141 of the protective film 140. That is, it is preferable that the edge of the opening portion 141 of the protective film 140 be completely covered with the resist film 160a.

Figure 9B:
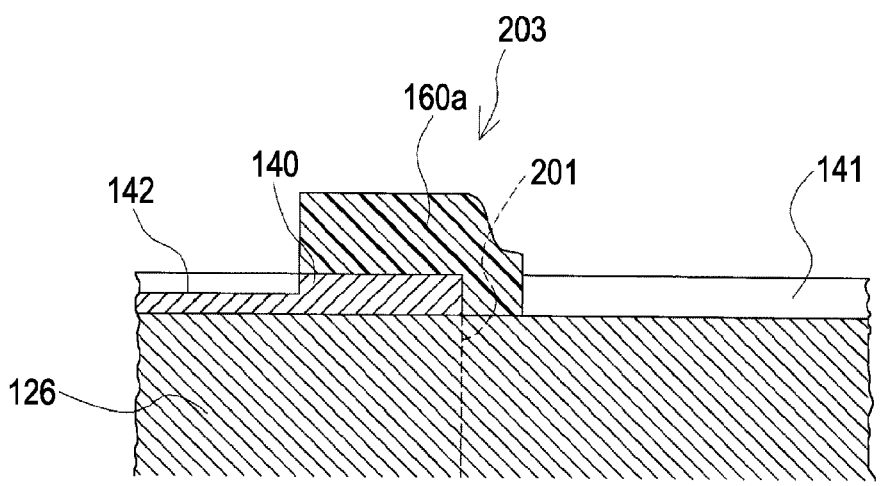
Figure 9C:
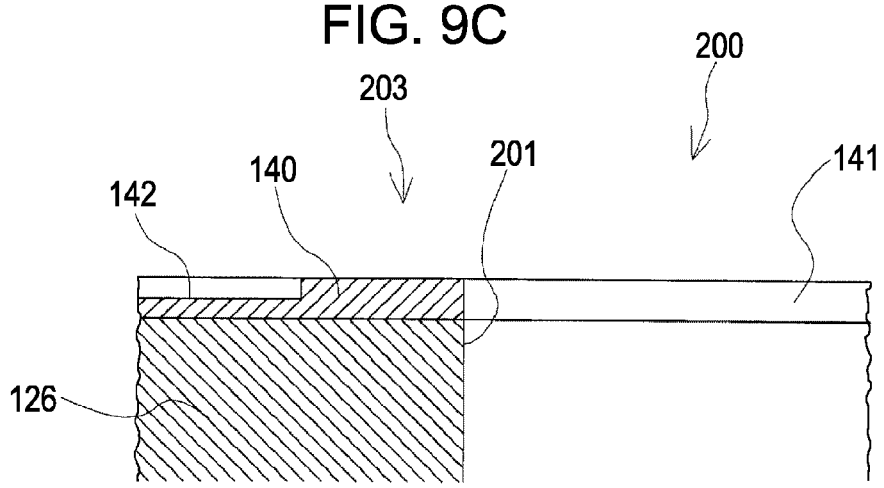

Then, as shown in FIG. 9B, the protective film 140 is half-etched using the resist film 160 as a mask to form a concave portion 142 in the protective film 140. That is, a portion of the protective film 140 corresponding to the acute portion 203 is removed in the region in which the small thickness portion 127 of the wafer 126 for a passage forming substrate is formed, thereby forming the concave portion 142. Then, the resist film 160 is removed, and as shown in FIG. 9C, anisotropic etching is performed with, for example, an aqueous solution of potassium hydroxide (KOH) on the wafer 126 for a passage forming substrate using the protective film 140 as a mask pattern, thereby forming the through holes 201 constituting the break pattern 200.

As described above, since the wafer 126 for a passage forming substrate is a silicon wafer having a (110) plane as its one surface, anisotropic wet etching is difficult to remove the first and second (111) planes 126a and 126b that are perpendicular to the (110) plane and the third and fourth (111) planes 126c and 126d that intersect the first and second (111) planes 126a and 126b at an acute angle (70.53°), respectively. For this reason, the inner surface of each of the through holes 201 formed by performing anisotropic etching on the wafer 126 for a passage forming substrate includes the first to fourth (111) planes 126a to 126d (see FIGS. 6A and 6B).

Figure 11A:
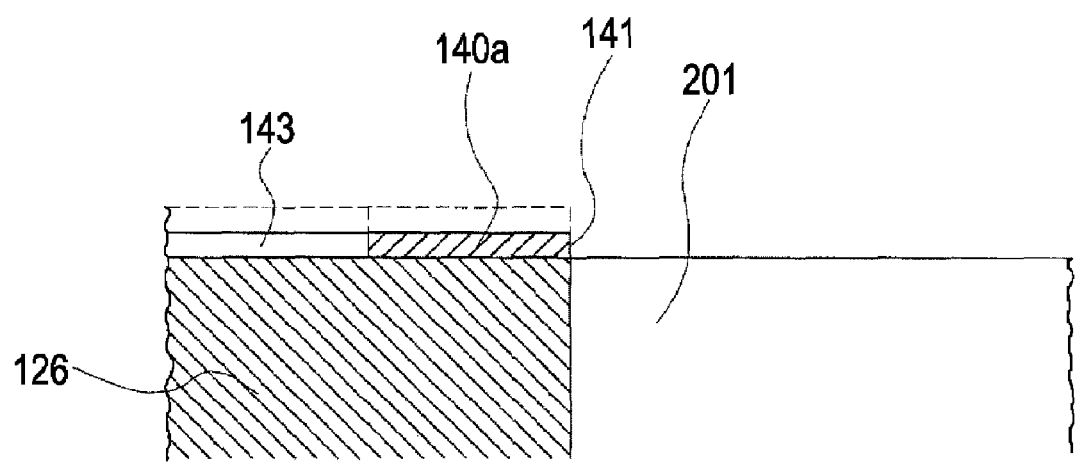
FIGS. 11A and 11B are cross-sectional views schematically illustrating the method of manufacturing the recording head according to the first embodiment of the invention.

Then, the entire protective film 140 is etched with, for example, hydrofluoric acid to form an opening portion 143 in the concave portion 142, as shown in FIGS. 10 and 11A. That is, openings are formed in the region of the wafer 126 for a passage forming substrate in which the small thickness portions 127 are formed. In this case, the protective film 140a having a predetermined width remains on the edge of the acute portion 203 of each of the through holes 201. That is, a mask pattern composed of the protective film 140 is formed outside the region of the wafer 126 for a passage forming substrate in which the small thickness portions 127 are formed, and a correction pattern composed of the protective film 140a is formed at the edge of the acute portions 203 of each of the through holes 201.

The protective film 140a, serving as the correction pattern, is formed in a substantially T shape in this embodiment. That is, the protective film 140a is formed in a substantially T shape including a first protective portion 144 that is provided along the third (111) plane 126c of the through hole 201 and a second protective portion 145 that is provided along the first (111) plane 126a that is continued to the leading end of the first protective portion 144.

Figure 11B:
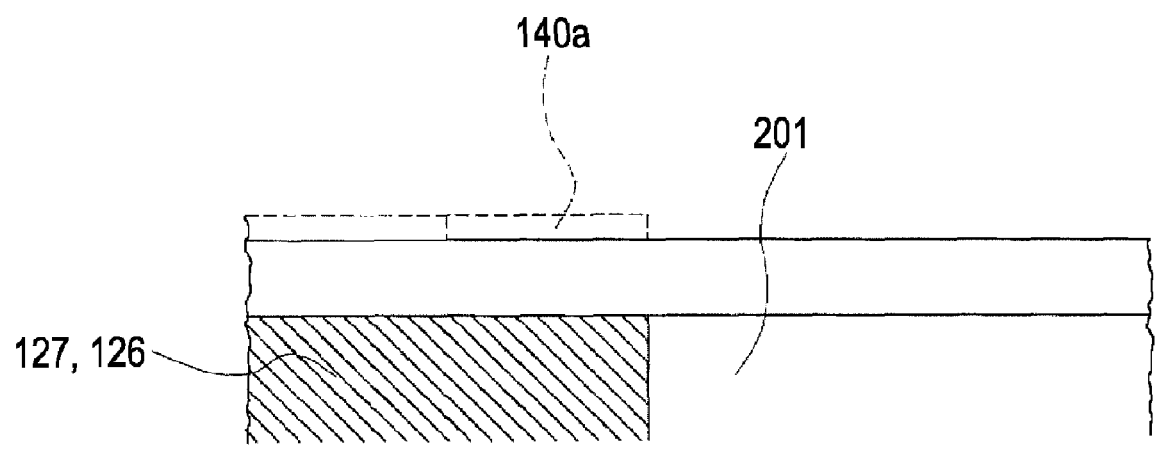

Then, as shown in FIG. 11B, the wafer 126 for a passage forming substrate is half-etched using the protective films 140 and 140a as a mask pattern to form the small thickness portions 127. In this case, a region of the wafer 126 for a passage forming substrate corresponding to the opening portion 143 is etched in the depth direction thereof, but another region of the wafer 126 in which the protective film 140a (correction pattern) is formed is etched from the edge of the protective film 140a in the plane direction. As the region of the wafer 126 for a passage forming substrate in which the protective film 140a is formed is etched, the protective film 140a is also etched gradually. Since the inner surface of the through hole 201 is composed of the first to fourth (111) planes 126a to 126d, it is difficult to etch the through hole 201. Therefore, the etching of the wafer 126 for a passage forming substrate and the protective film 140a does not start from the inner surface of the through hole 201.

Therefore, a region of the wafer 126 for a passage forming substrate facing the acute portions 203 starts to be etched with the protective film 140a being removed. That is, the etching of the region of the wafer 126 for a passage forming substrate facing the acute portions 203 starts considerably later than the etching of another region of the wafer 126 for a passage forming substrate corresponding to the opening portion 143.

The shape of the protective film (correction pattern) 140a is not particularly limited, but it is preferable to form the protective film such that a distance d1 from one end 145a of the second protective portion 145 facing the through hole 201 to the first protective portion 144 and a distance d2 from the other end 145b of the second protective portion 145 opposite to the through hole 201 to the first protective portion 144 satisfy d1≧d2 (see FIG. 10). In this way, when the small thickness portion 127 is formed by etching, etching starts from both ends 145a and 145b of the second protective portion 145, and finally, a region of the wafer 126 for a passage forming substrate corresponding to the acute portion 203 is exposed by etching. That is, it is possible to reduce effects to etch the region of the wafer 126 for a passage forming substrate corresponding to the acute portion 203.

Figure 12A:
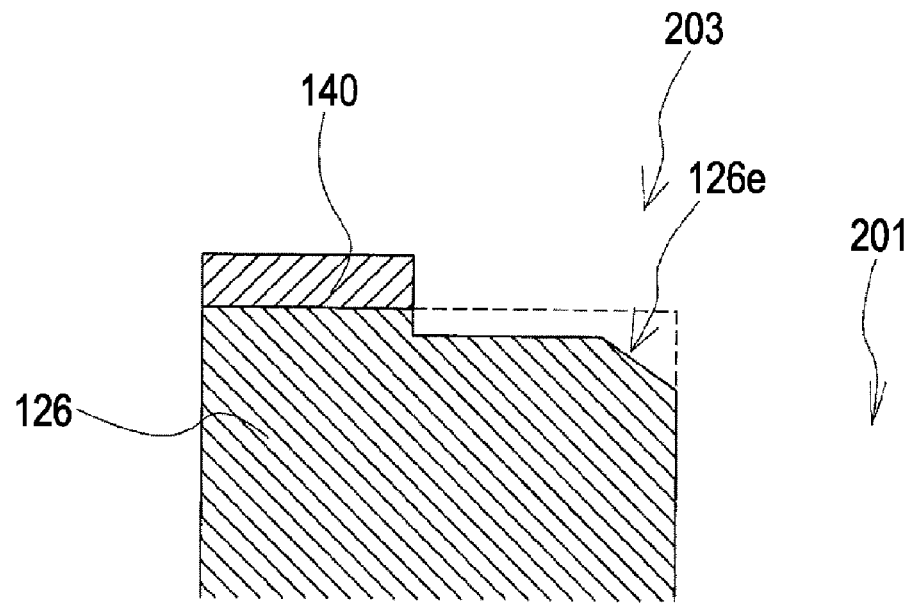
FIGS. 12A and 12B are cross-sectional views schematically illustrating a method of manufacturing a recording head according to the related art.
Figure 12B:
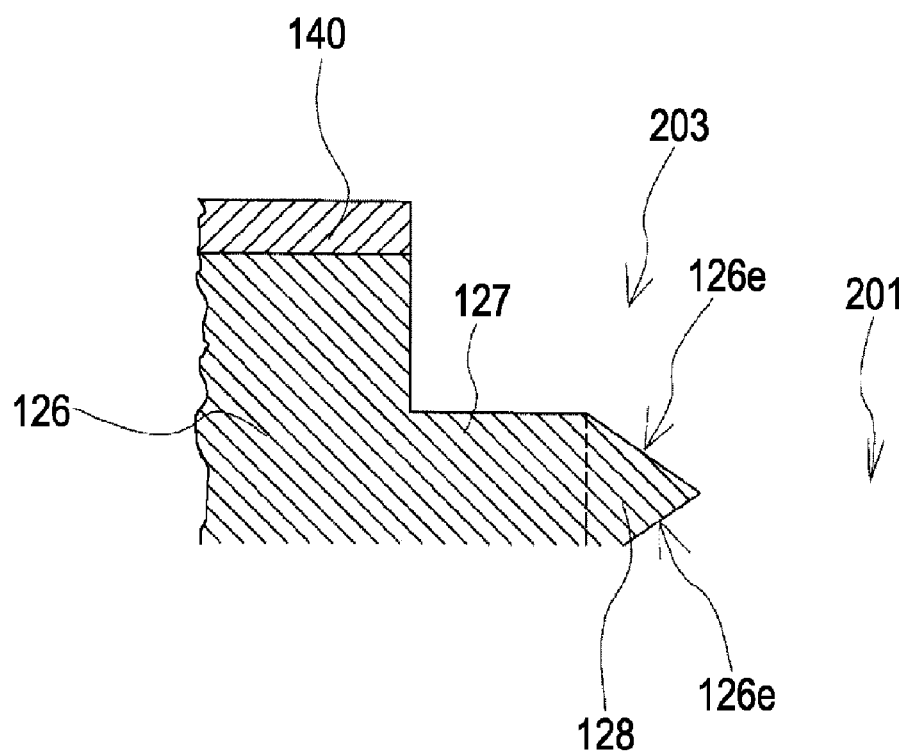

FIGS. 12A and 12B and FIGS. 13A and 13B are cross-sectional views taken along the lines of XII-XII and XIII-XIII in FIG. 10, respectively. As shown in FIG. 12A, when the wafer 126 for a passage forming substrate is etched without the protective film (correction pattern) 140a being formed, the wafer 126 for a passage forming substrate is etched in the depth direction thereof, and the edge of the acute portion 203 is also gradually etched. As a result, a fifth (111) plane 126e is exposed in the depth direction. In addition, as shown in FIG. 12B, a residual portion 128 including the fifth (111) plane 126e is formed in the acute portion 203 of the through hole 201.

Figure 13A:
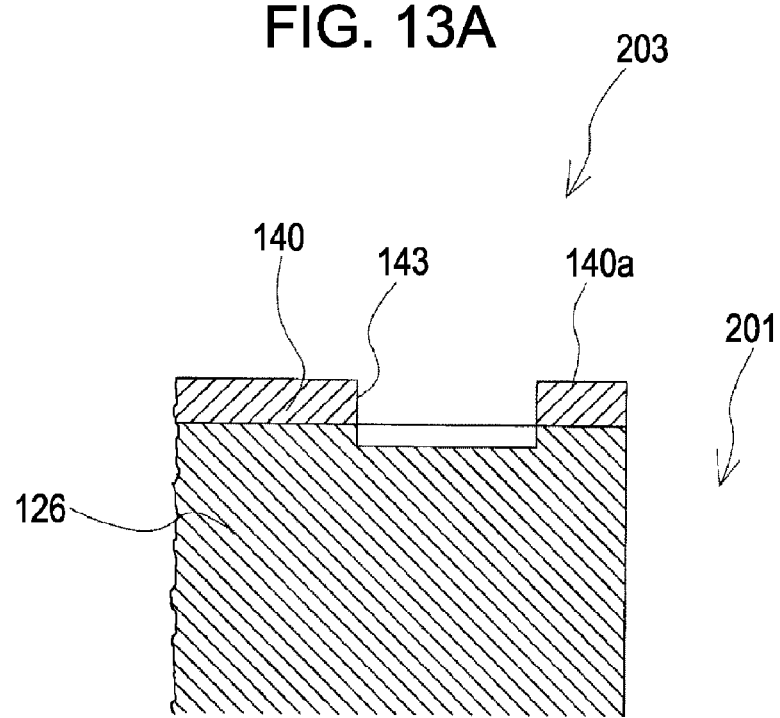
FIGS. 13A and 13B are cross-sectional views schematically illustrating the method of manufacturing the recording head according to the first embodiment of the invention.
Figure 13B:
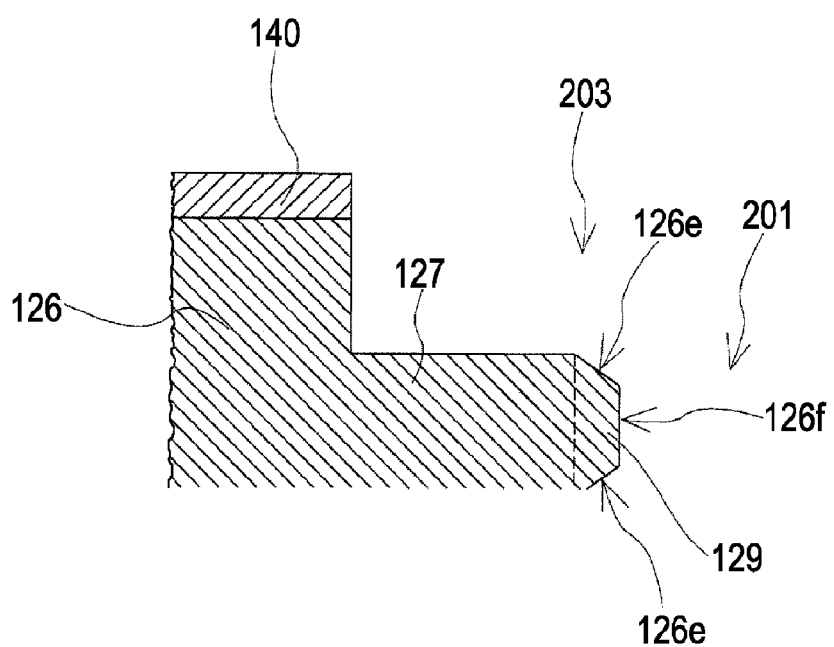

In contrast, as shown in FIG. 13A, when the wafer 126 for a passage forming substrate is etched with the protective film (correction pattern) 140a being formed, first, a region of the wafer 126 for a passage forming substrate corresponding to the opening portion 143 is gradually etched. Since anther region of the wafer 126 for a passage forming substrate corresponding to the edge of the acute portion 203 is covered with the protective film 140a, the etching of this region is delayed. As a result, it is possible to considerably reduce the etching amount of the region of the wafer 126 for a passage forming substrate corresponding to the edge of the acute portion 203. Therefore, as shown in FIG. 13B, a residual portion 129 is formed in the acute portion 203, and the residual portion 129 includes the fifth (111) plane 126e and an end surface 126f that is perpendicular to the (100) plane.

Thereafter, although not shown in the drawings, the protective film 140 formed on the surface of the wafer 126 for a passage forming substrate is removed by an etchant, such as hydrofluoric acid (HF), and for example, an expanded ring is used to apply an external force to the wafer 126 for a passage forming substrate. In this way, the wafer 126 for a passage forming substrate is divided into a plurality of passage forming substrates 26 along the break pattern 200.

In this case, since the residual portion 129 is composed of the fifth (111) plane 126e that is formed in the depth direction of the wafer 126 for a passage forming substrate and the end surface 126f that is perpendicular to the (100) plane in the depth direction of the wafer 126 for a passage forming substrate (see FIG. 13B), it is possible to accurately divide the wafer 126 for a passage forming substrate. That is, since cracks are likely to occur in the end surface 126f of the residual portion 129, the fragile portions 202 between the through holes 201 forming the break pattern 200 are reliably broken, which makes it possible to accurately divide the wafer 126 for a passage forming substrate into a plurality of passage forming substrates 26. In this way, it is possible to prevent minute chips from being generated from broken surfaces. As a result, it is possible to prevent the chips from being adhered to the ink passages and thus prevent nozzle clogging.

Meanwhile, when the residual portion 128 is composed of only the fifth (111) plane 126e (see FIG. 12B), the breakability of the residual portion 128 is considerably lowered, which makes it difficult to accurately divide the wafer 126 for a passage forming substrate along the break pattern 200.

Further, in this embodiment, the protective film (correction pattern) 140a is provided in the acute portion where the first (111) plane and the third (111) plane intersect each other, but the invention is not limited thereto. The protective film (correction pattern) 140 may also be provided in the acute portion where the second (111) plane and the fourth (111) plane intersect each other. Actually, the break pattern 200 and the small thickness portions 127 are formed at the same time when passages, such as the pressure generating chambers 25, are formed in the wafer 126 for a passage forming substrate, but the invention is not limited thereto. The break pattern 200 and the small thickness portions 127 may be separately formed from passages such as the pressure generating chambers 25.

Other Embodiments

Although the embodiment of the invention has been described above, the invention is not limited thereto. For example, in the above-described embodiment, the invention is applied to the break pattern formed on the first cut lines, but the invention may be applied to the break pattern formed on the second cut lines. For example, in the above-described embodiment, the break pattern is formed on the wafer for a passage forming substrate, but the invention is not limited thereto. The break pattern may be formed on substrates (wafers) other than the wafer for a passage forming substrate.

Further, in the above-described embodiment, the ink jet recording head is used as an example of the liquid ejecting head, but the invention can be applied to various kinds of liquid ejecting heads. In addition, the invention can be applied to a method of manufacturing liquid ejecting heads that eject liquid materials other than ink. For example, the invention can be applied to various kinds of liquid ejecting heads, such as various types of recording heads that are used for image recording apparatuses, such as printers, color material ejecting heads that are used to manufacture color filters of, for example, liquid crystal displays, electrode material ejecting heads that are used to form electrodes of, for example, organic EL displays and FEDs (field emission displays), and bio-organic material ejecting heads that are used to manufacture bio-chips.

Further, the invention can be used to divide a silicon wafer into a plurality of silicon substrates, in addition to manufacturing the liquid ejecting head.

What is claimed is:
1. A method of processing a silicon wafer, comprising:
forming, on a silicon wafer having a (110) plane as its one surface, a break pattern including a plurality of through holes, each of which has a first (111) plane that is perpendicular to the (110) plane of the silicon wafer, a second (111) plane that is opposite to the first (111) plane, a third (111) plane that is perpendicular to the (110) plane and intersects the first (111) plane at an acute angle, and a fourth (111) plane that is opposite to the third (111) plane, is perpendicular to the (110) plane, and intersects the second (111) plane at an acute angle, using anisotropic etching;
performing the anisotropic etching on the silicon wafer using a mask pattern having a predetermined shape to form, around the break pattern, a thin portion that has a smaller thickness than other portions of the silicon wafer; and
dividing the silicon wafer into a plurality of silicon substrates along the break pattern,
wherein the forming of the thin portion includes:
forming a correction pattern that covers the edges of acute portions of each of the through holes in the silicon wafer so as to protrude from the edges by a predetermined width; and
performing the anisotropic etching on the silicon wafer using the mask pattern including the correction pattern, thereby delaying the start of the etching of the edges of the acute portions in the silicon wafer.
2. The method of processing a silicon wafer according to claim 1, wherein the break pattern is formed along the first (111) plane such that the first (111) plane and the second (111) plane of the through holes are alternately arranged on a straight line.

3. A method of manufacturing a liquid ejecting head including a passage forming substrate in which pressure generating chambers which communicate with nozzles and to which pressure for ejecting liquid droplets from the nozzles is applied are formed, the method comprising:

integrally forming a plurality of passage forming substrates on a wafer for a passage forming substrate, which is a silicon wafer having a (110) plane as its one surface; and dividing the wafer for a passage forming substrate into the plurality of the passage forming substrates using the method of processing a silicon wafer according to claim 1.

* * * * *